US011802910B1

(12) United States Patent
Yang

(10) Patent No.: US 11,802,910 B1
(45) Date of Patent: Oct. 31, 2023

(54) PROBE APPARATUS FOR TESTING SEMICONDUCTOR DEVICES

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 13 days.

(21) Appl. No.: 17/742,629

(22) Filed: May 12, 2022

(51) Int. Cl.
*G01R 31/28* (2006.01)
*G01R 1/04* (2006.01)

(52) U.S. Cl.
CPC ....... *G01R 31/2889* (2013.01); *G01R 1/0458* (2013.01); *G01R 31/2887* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 6,388,457 | B1* | 5/2002 | Loh .................. | G01R 1/0466 324/762.02 |
| 2005/0026491 | A1* | 2/2005 | Gattuso ............... | G01R 1/0466 439/342 |
| 2006/0046531 | A1* | 3/2006 | Sinclair ................ | G01R 1/0466 439/70 |
| 2013/0181733 | A1 | 7/2013 | Kikuchi et al. | |

FOREIGN PATENT DOCUMENTS

| CN | 107976561 A | 5/2018 |
| TW | 202040148 A | 11/2020 |
| TW | 202211337 A | 3/2022 |

* cited by examiner

*Primary Examiner* — Tung X Nguyen
(74) *Attorney, Agent, or Firm* — Muncy, Geissler, Olds & Lowe, P.C.

(57) ABSTRACT

A probe apparatus for testing a semiconductor device is provided. The testing device includes a socket having a cavity for accommodating a device under test (DUT), and a cover disposed on the socket. The socket includes a thermal conductive material. The cover includes a plate, a circuit board attached to the plate, and an opening penetrating the plate and the circuit board, exposing the cavity of the socket.

11 Claims, 11 Drawing Sheets

PROBE APPARATUS FOR TESTING SEMICONDUCTOR DEVICES

TECHNICAL FIELD

The present disclosure relates to a probe apparatus for testing a semiconductor device.

DISCUSSION OF THE BACKGROUND

The evolution of semiconductor technology has resulted in a demand for more complex memory operations and high-speed semiconductor memory devices, such as dynamic random access memory (DRAM) devices. A probe apparatus is used to test the electrical characteristics of a device under test (DUT) (e.g., an integrated circuit (IC) device) to determine whether the DUT satisfies product specifications. As well the DUT should be monitored throughout the electrical test to ensure probe contact the DUT. Therefore, an improved testing device and probe apparatus is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a testing device. The testing device includes a socket having a cavity for accommodating a device under test (DUT), and a cover disposed on the socket. The socket includes a thermal conductive material. The cover includes a plate, a circuit board attached to the plate, and an opening penetrating the plate and the circuit board for exposing the cavity of the socket.

Another aspect of the present disclosure provides a probe apparatus. The probe apparatus includes a platform, a manipulator on the platform having a probe, and a testing device on the platform. The testing device includes a socket having a cavity accommodating a device under test (DUT), and a cover disposed on the socket. The socket includes a thermal conductive material. The cover includes a plate, a circuit board attached to the plate, and an opening penetrating the plate and the circuit board for exposing the DUT in the cavity of the socket.

Another aspect of the present disclosure provides a method for testing a semiconductor device. The method includes providing a socket having a cavity receiving the semiconductor device, wherein the socket includes a thermal conductive material, disposing a cover on the socket, wherein the cover has an opening exposing the semiconductor device, disposing the socket and the cover on a platform, and moving a probe into the first opening to contact the semiconductor device.

The subject disclosure provides a testing device receiving a DUT therein. The active surface of the DUT can face the opening of the testing device so that a user of the probe apparatus can observe the DUT and ensure probe contact with the DUT through the opening during the probe test. Furthermore, the testing device can include a thermal adjuster to adjust the temperature of the DUT. For this purpose, the socket of the testing device can include a thermal conductive material, such as copper. Accordingly, the DUT can be adjusted to a desired environment for testing.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
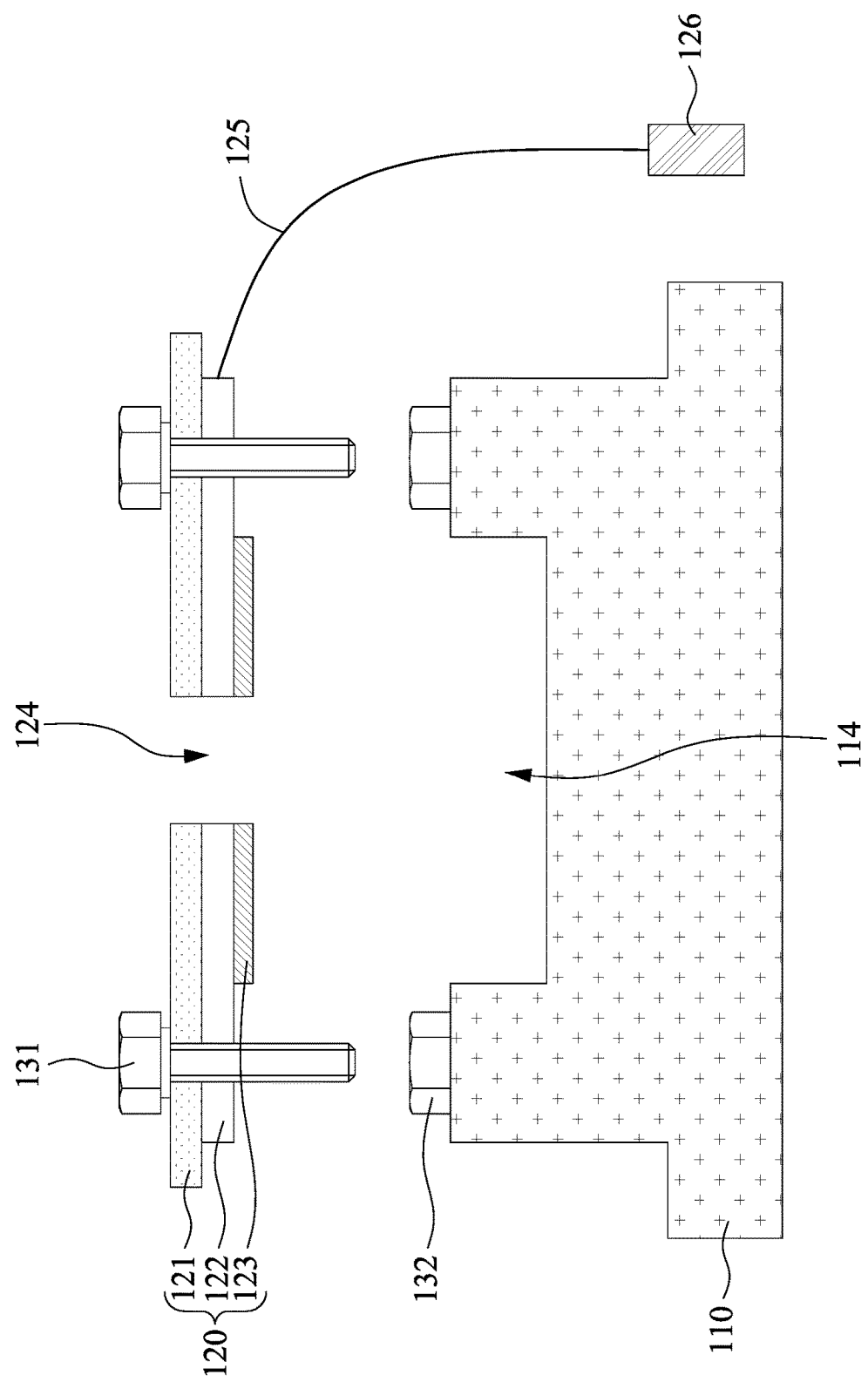
FIG. 1 is a cross-section of a testing device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-section of a testing device 100, in accordance with some embodiments of the present disclosure. FIG. 1 is an exploded view of the testing device 100. Referring to FIG. 1, the testing device 100 includes a socket 110, a cover 120, fasteners 131 and 132, a cable 125, and a terminal 126.

The socket 110 can support a device under test (DUT). The DUT may be, but is not limited to, an integrated circuit (IC) device, a wafer fragment, a semiconductor substrate, a circuit, a memory cell (such as a dynamic random access memory cell (DRAM cell)), a printed circuit board (PCB) mounted with electronic components, etc. The DUT may also include a packaged component, such as a semiconductor package, a ball grid array (BGA) package, a pin grid array (PGA) package, a window ball grid array (WBGA) package, a memory package, etc.

The socket 110 can have a discontinuous lateral surface. In some embodiments, the socket 110 can have an underside portion and an upper portion on the underside portion. The underside portion has a width different from that of the upper portion. For example, the underside portion can be wider than the upper portion. In some embodiments, the width of the underside portion can be identical to that of the upper portion. The underside portion can have a height different from that of the upper portion. For example, the underside portion can be higher than the upper portion. In some embodiments, the height of the underside portion can be identical to that of the upper portion.

The socket 110 can include a cavity 114. In some embodiments, the cavity 114 can be recessed from the top surface of the socket 110. The cavity 114 can accommodate the DUT. In some embodiments, the depth of the cavity 114 can be equal to or less than a thickness of the DUT. In some embodiments, the width of the cavity 114 can equal or exceed a width of the DUT.

The socket 110 can be a highly thermal conductive material. In some embodiments, the material of the socket 110 can be metal. For example, the socket 110 can include copper.

The cover 120 may be disposed on the socket 110. In some embodiments, the cover 120 can include a plate 121, a circuit board 122, and an adhesive 123. The cover 120 can have a width different from that of the upper portion of the socket 110. For example, the width of the cover 120 can be greater than that of the upper portion of the socket 110. In some embodiments, the width of the cover 120 can be substantially identical to that of the upper portion of the socket 110.

In some embodiments, the cover 120 can have an opening 124. The opening 124 can penetrate the cover 120. The opening 124 may correspond to the cavity 114 of the socket 110. In some embodiments, the opening 124 can have a width different from that of the cavity 114. For example, the width of the opening 124 can be less than the width of the cavity 114. That is, the opening 124 can expose at least a part of the cavity 114.

The plate 121 of the cover 120 may be disposed on the socket 110. In some embodiments, the plate 121 can have a width different from that of the socket 110. For example, the width of the plate 121 can be greater than that of the upper portion of the socket 110. On the contrary, the width of the plate 121 may be less than that of the underside portion of the socket 110. In some embodiments, the opening 124 can penetrate the plate 121.

In some embodiments, the plate 121 can be made of metal. For example, the plate 121 can include steel. That is, the plate 121 may be a steel plate.

The circuit board 122 of the cover 120 can be attached to the cover 121. The circuit board 122 can be disposed between the cover 121 and the socket 110. The circuit board 122 can have a width different from that of the cover 121. For example, the width of the circuit board 122 can be less than the width of the cover 121. In one embodiment, the circuit board 122 can have a width substantially identical to that of the upper portion of the socket 110. In another embodiment, the width of the circuit board 122 can be different from that of the upper portion of the socket 110. In some embodiments, the opening 124 can penetrate the circuit board 122.

In some embodiments, the circuit board 122 can extend to cover a part of the cavity 114 of the socket 110. The circuit board 122 can include one or more contact pads located on a surface of the circuit board 122 facing the cavity 114. In some embodiments, the contact pads can be configured to connect to the DUT accommodated in the cavity 114. In another embodiments, the contact pads can be configured to connect to external units, such as a signal source or a power supply. The circuit board 122 may be an insulating board having interconnection patterns formed therein, such as a printed circuit board (PCB). In some embodiments, the circuit board 122 can be a flexible printed circuit (FPC).

The adhesive 123 is disposed on the circuit board 122. In some embodiments, the adhesive 123 can be disposed between the circuit board 122 and the socket 110. The adhesive 123 can be attached to the circuit board 122. In some embodiments, the adhesive 123 can have a lateral edge substantially aligned with a lateral surface of the cavity 114. The adhesive 123 can have a width substantially identical to that of the cavity 114. In some embodiments, the opening 124 can penetrate the adhesive 123.

In some embodiments, the adhesive 123 can be disposed between the circuit board 122 and the DUT accommodated in the cavity 114. In some embodiments, the adhesive 123 can be electrically conductive, such that the circuit board 122 can electrically connect to the DUT in the cavity 114 of the socket 110 through the adhesive 123.

When a DUT is disposed in the cavity 114, an optional internal probe test may be performed. An internal probe may be used to contact the DUT through the opening 124.

Figure 3A:
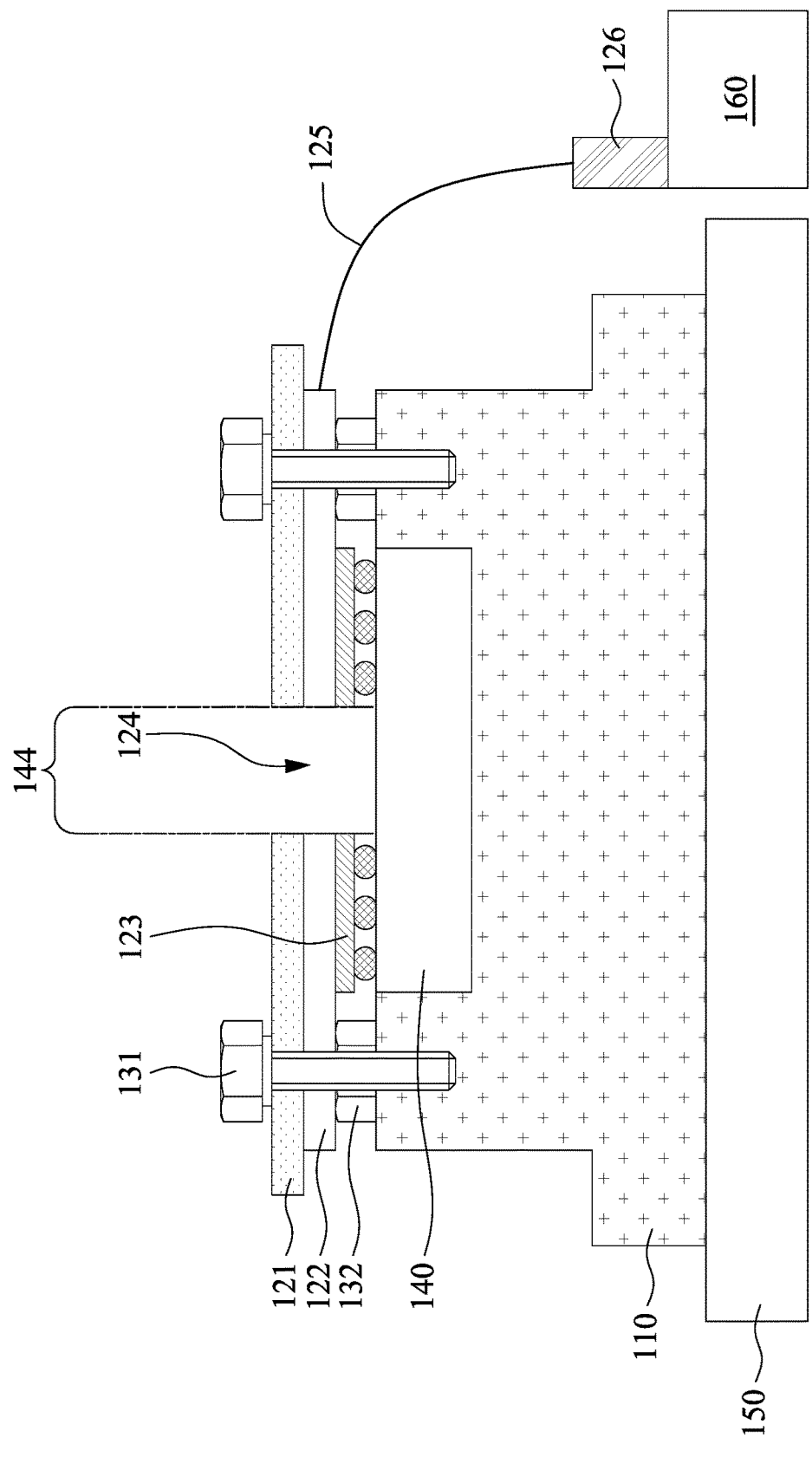
FIG. 3A is a cross-section of a testing device along the section line A-A' of FIG. 2, in accordance with some embodiments of the present disclosure.

The cover 120 can be connected to the socket 110 via the fasteners 131 and 132 (as shown in FIG. 3A). The testing device 100 can include one or more fasteners 131 and 132. In some embodiments, the fastener 131 matches the fastener 132. For example, the fastener 131 can be, but is not limited to, a bolt. The fastener 132 can be, but is not limited to, a nut.

Figure 3B:
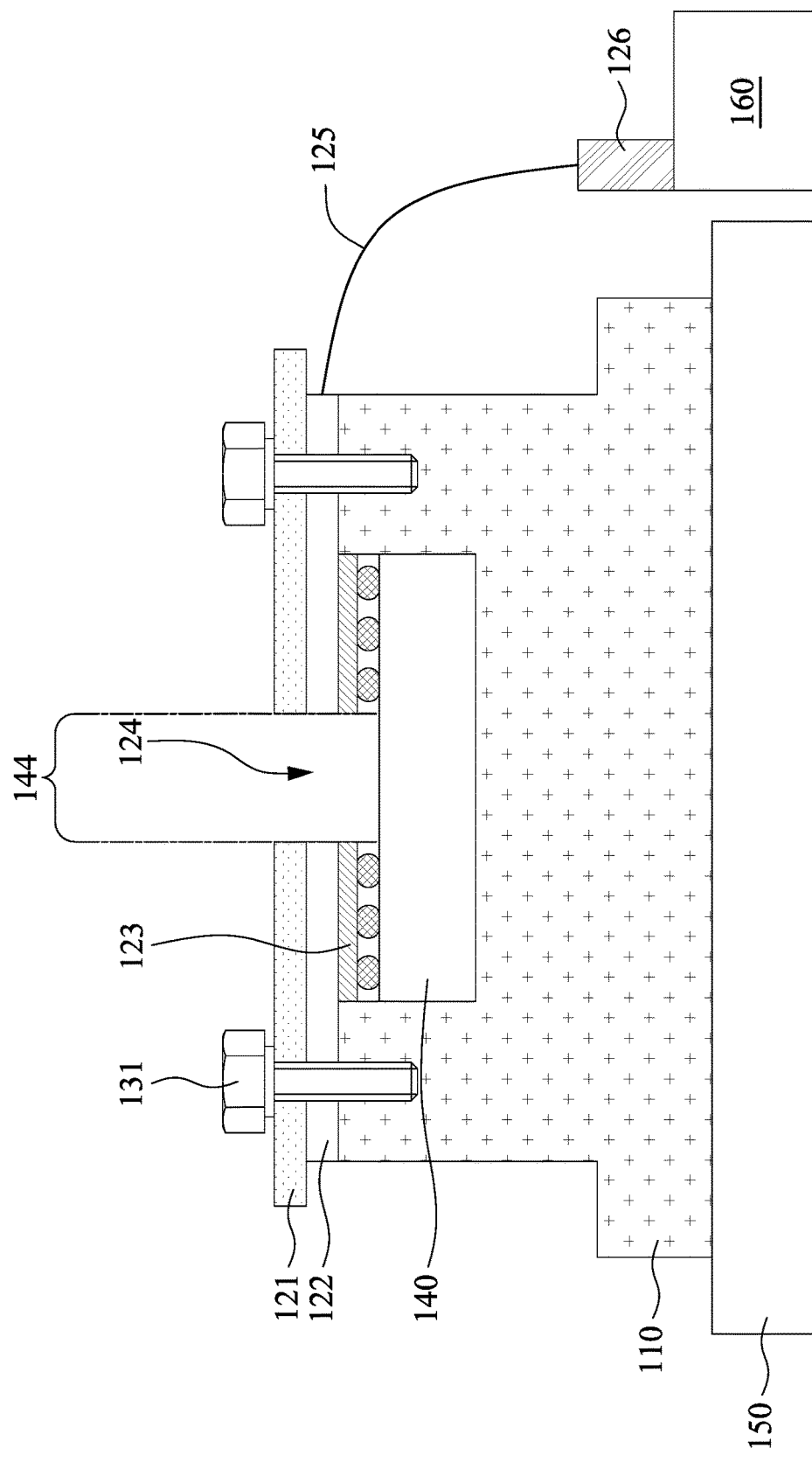
FIG. 3B is a cross-section of a testing device along the section line A-A' of FIG. 2, in accordance with some embodiments of the present disclosure.

In another embodiment, the socket 110 can have holes corresponding to the fasteners 131. In this manner, the fasteners 132 are optional. That is, the fasteners 131 can connect the socket 110 and the cover 120 by insertion into the socket 110 (as shown in FIG. 3B).

In some embodiments, the terminal 126 is provided to connect the circuit board 122 to external units through the cable 125. The test signals can be received at the terminal 126 and through the cable 125, and transmitted to the DUT in the socket 110 through the circuit board 122.

Figure 2:
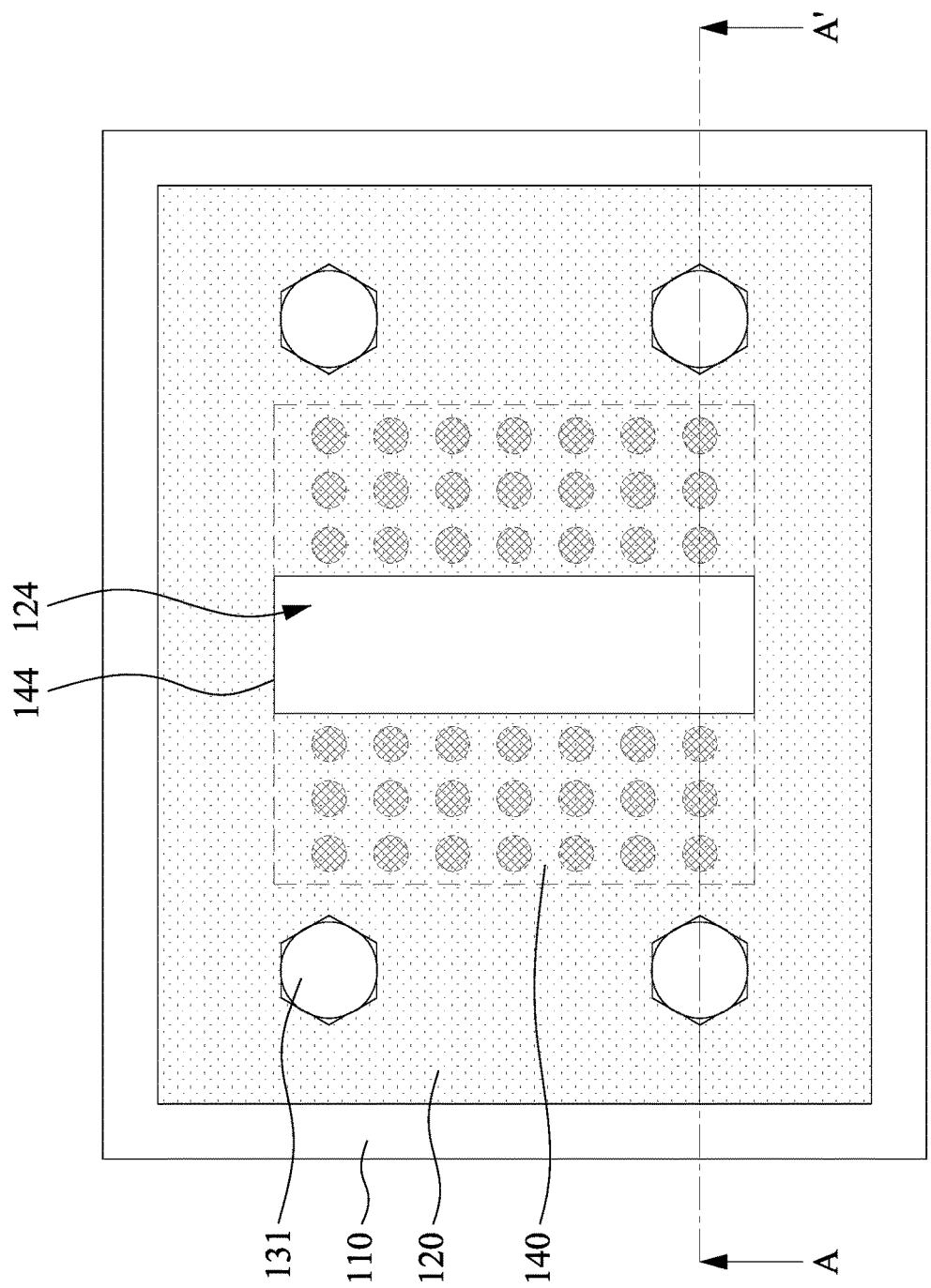
FIG. 2 is a top view of a testing device, in accordance with some embodiments of the present disclosure.

FIG. 2 is a top view of a testing device 200, in accordance with some embodiments of the present disclosure. The testing device 200 is similar to the testing device 100 in FIG. 1, differing in that the testing device 200 further includes a DUT 140 in the cavity 114.

Referring to FIG. 2, the testing device 200 includes a socket 110, a cover 120, fasteners 131, and a DUT 140. Multiple elements are identically labeled, and thus description thereof is omitted for clarity.

The socket 110 can support the DUT 140. The DUT 140 can be covered by the cover 120. The cover 120 and the socket 110 can be connected by the fasteners 131, such that the DUT 140 is retained in the socket 110. In some embodiments, a portion 144 of the DUT 140 can be exposed by the opening 124 of the cover 120.

FIG. 3A is a cross-section of a testing device 300A along the section line A-A' of FIG. 2, in accordance with some embodiments of the present disclosure. The testing device 300A is similar to that in FIG. 1. Referring to FIG. 3A, the testing device 300A includes a socket 110, a cover 120, fasteners 131 and 132, a cable 125, a terminal 126, a DUT 140, a thermal adjuster 150, and a test head 160.

Referring to FIG. 3A, the cover 120 is connected to the socket 110 by the fasteners 131 and 132, such that the DUT 140 can be retained in the cavity 114 of the socket 110. The DUT 140 may include, but is not limited to, an integrated circuit (IC) device, a wafer fragment, a semiconductor substrate, a circuit, a memory cell (such as a dynamic random access memory cell (DRAM cell)), a printed circuit board (PCB) mounted with electronic components, etc. The DUT 140 may also include a packaged component, such as a semiconductor package, a ball grid array (BGA) package, a pin grid array (PGA) package, a window ball grid array (WBGA) package, a memory package, etc.

The DUT 140 can include a portion 144 exposed by the opening 124. When the DUT 140 is disposed in the socket 110, an optional internal probe test may be performed. An internal probe may be used to contact the portion 144 of the DUT through the opening 124. For example, when the DUT 140 is a WBGA package component, the portion 144 can be the window of the DUT 140. In some embodiments, the width of the portion 144 can be substantially identical to the opening 124. The width of the portion 144 is about 1000 μm. For example, the width of the portion 144 can be about 1040 μm. In some embodiments, the DUT 140 has a thickness substantially identical to the depth of the cavity 114 of the socket 110.

In some embodiments, the DUT 140 has an active surface facing the cover 120. The DUT 140 can have one or more contacts on the active surface to electrically connect to the circuit board 122. In some embodiments, the DUT 140 can be connected to the circuit board 122 through the adhesive 123. In some embodiments, the DUT 140 may be free from electrical connection with the socket 110.

The thermal adjuster 150 is coupled to the socket 110. In some embodiments, the socket 110 can be disposed on and adjacent to the thermal adjuster 150. In one embodiment, the width of the thermal adjuster 150 can be different from that of the socket 110. For example, the width of the thermal adjuster 150 can be greater than that of the socket 110. In another embodiment, the width of the thermal adjuster 150 may be identical to that of the socket 110.

During electrical and/or reliability tests of the DUT 140, the DUT 140 needs to be a predetermined temperature to obtain electrical data for analysis. In some embodiments, the thermal adjuster 150 can be coupled to the socket 110, such that a temperature of the socket 110 is adjusted. In this case, a temperature of the DUT 140 can be adjusted by the thermal adjuster 150 through the socket 110. The thermal adjuster 150 can conduct heat energy to or from the DUT 140. In some embodiments, the thermal adjuster 150 may be a plate capable of increasing or decreasing its surface temperature. Thus, a testing temperature of the DUT 140 may be adjusted depending on requirements, by controlling the surface temperature of the thermal adjuster 150.

The testing device 300A can include a test head 160 for connecting to a signal source. The test head 160 can provide an electrical path between the signal source and the DUT 140. For example, the test head 160 may connect with the cable 125 through the terminal 125. The test head 160 can be electrically connected to the circuit board 122 through the terminal 126 and the cable 125. The test head 160 can transmit test signals to the DUT 140 through the circuit board 122.

FIG. 3B is a cross-section of a testing device 300B along the section line A-A' of FIG. 2, in accordance with some embodiments of the present disclosure. The testing device 300B is similar to the testing device 300A in FIG. 3A, differing in that the fasteners 131 can connect the socket 110 and the cover 120 directly by insertion into the socket 110.

In some embodiments, the thickness of the DUT 140 can be less than the depth of the cavity 114 of the socket 110. The adhesive 123 may be located in the cavity 114 of the socket 110 and electrically connected to the DUT 140.

Figure 4A:
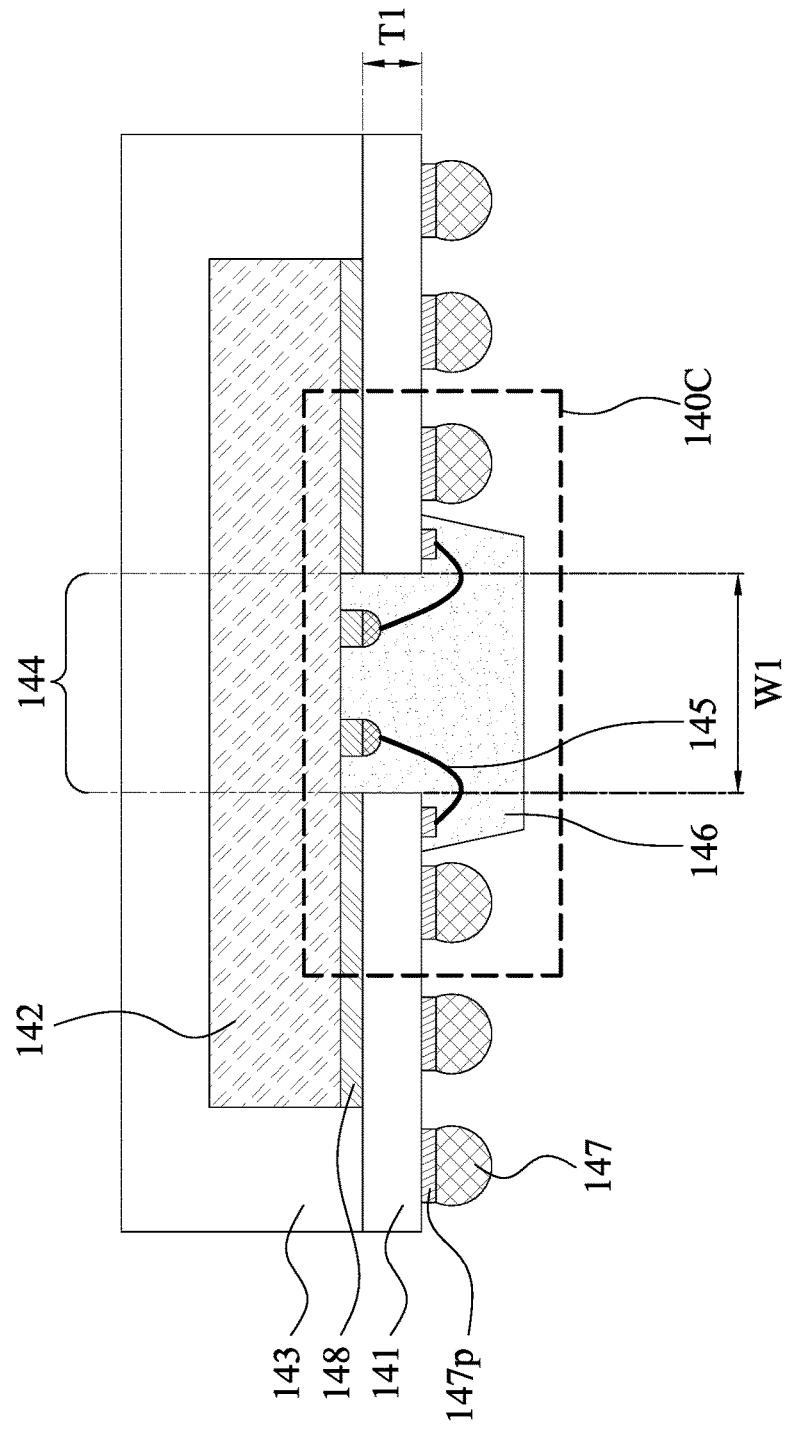
FIG. 4A is a cross-section of a semiconductor device, in accordance with some embodiments of the present disclosure.

FIG. 4A is a cross-section of a semiconductor device 140A, in accordance with some embodiments of the present disclosure. The semiconductor device 140A can be the DUT 140 as described. Referring to FIG. 4A, the semiconductor device 140A includes a substrate 141, a die 142, a molding 143, a window 144, bonding wires 145, an underfill 146, contacts 147, contact pads 147p, and an adhesive 148. The content in the block 140C would be enlarged and shown in FIG. 4C.

The substrate 141 can include a conductive trace and a dielectric layer (not shown). The substrate 141 can be a semiconductor substrate. In some embodiments, the substrate 141 includes semiconductor material such as silicon, germanium, gallium, arsenic, and combinations thereof. For example, the substrate 141 can be a copper foil substrate. In some embodiments, the substrate 141 includes material such as ceramic, glass or the like. In some embodiments, the substrate can have a thickness T1 less than 500 μm. In some embodiments, the thickness T1 can be less than 300 μm. In some embodiments, the thickness T1 can be greater than 50 μm. In some embodiments, the thickness T1 can be greater than 100 μm. For example, the thickness T1 can be about 230 μM.

The die 142 can be a DRAM chip. In some embodiments, the die 142 can be singulated from a semiconductor wafer by a mechanical blade or a laser blade. In some embodiments, the die 142 includes a variety of electrical circuits suitable for a particular application. In some embodiments, the die 142 can include any one of various known types of semiconductor devices such as memories, microprocessors, application-specific integrated circuits (ASICs) or the like. In some embodiments, the die 142 is a logic device die or the like.

In some embodiments, the die 142 is bonded over the substrate 141 by an adhesive 148. The adhesive 148 can be a die attach film (DAF), glue, or the like.

The molding 143 can be disposed on the die 142 and the substrate 141. The molding 143 can cover the die 142. In some embodiments, the molding 143 can cover a top surface of the die 142. The molding 143 can cover a lateral surface of the die 142. In some embodiments, the molding 143 may cover the adhesive 148.

In some embodiments, the molding 143 can be a single-layer film or a composite stack. In some embodiments, the molding 143 includes various materials, such as molding compound, molding underfill, epoxy, resin, or the like. In some embodiments, the molding 143 has high thermal conductivity, low moisture absorption rate, and a high flex strength.

The substrate 141 can have an opening exposing a portion of the die 142. In some embodiments, the die 142 can have an active surface facing the substrate 141. The die 142 can have a window 144 on the active surface. That is, the window 144 can be exposed by the opening of the substrate 141. In some embodiments, the window 144 can have a width W1 about 1000 μm. For example, the width W1 can be about 1040 μm.

In some embodiments, the die 142 can be electrically connected to the substrate 141 by a bonding wire 145. In some embodiments, the bonding wire 145 can include copper, gold or any other suitable material. Details thereof can be found in the description of FIG. 4C.

The underfill 146 can be disposed on the substrate 141 and the die 142. The underfill 146 can cover a part of the die 142. The underfill 146 can cover the active surface of the die 142. The underfill 146 can be fill in the opening of the substrate 141. In some embodiments, the underfill 142 can cover the window 144. A part of the substrate 141 can be covered by the underfill 146. In some embodiments, the underfill 146 can surround the bonding wire 145. For example, the underfill 146 can encapsulate the bonding wire 145.

In some embodiments, the underfill 146 can be a single-layer film or a composite stack. In some embodiments, the underfill 146 includes various materials, such as molding compound, molding underfill, epoxy, resin, or the like. In some embodiments, the underfill 146 has a high thermal conductivity, a low moisture absorption rate and a high flexural strength.

One or more contact pads 147p can be disposed on the substrate 141. That is, the contact pads 147p can protrude from an underside surface of the substrate 141. In another embodiment, the contact pads 147p can be embedded in the substrate 141. That is, an underside surface of the contact pads 147p can be coplanar with that of the substrate 141.

One or more contacts 147 can be disposed on the substrate 141. In some embodiments, the contacts 147 can be disposed on the contact pads 147p. The contact pads 147p can electrically connect to the contacts 147. In some embodiments, the contacts 147 include conductive material such as solder, copper, nickel, or gold. In some embodiments, the contacts 147 is a solder ball, a ball grid array (BGA) ball, controlled collapse chip connection (C4) bump, microbump, a pillar or the like. In some embodiments, the contacts 147 are spherical, hemispherical, or cylindrical.

Figure 4B:
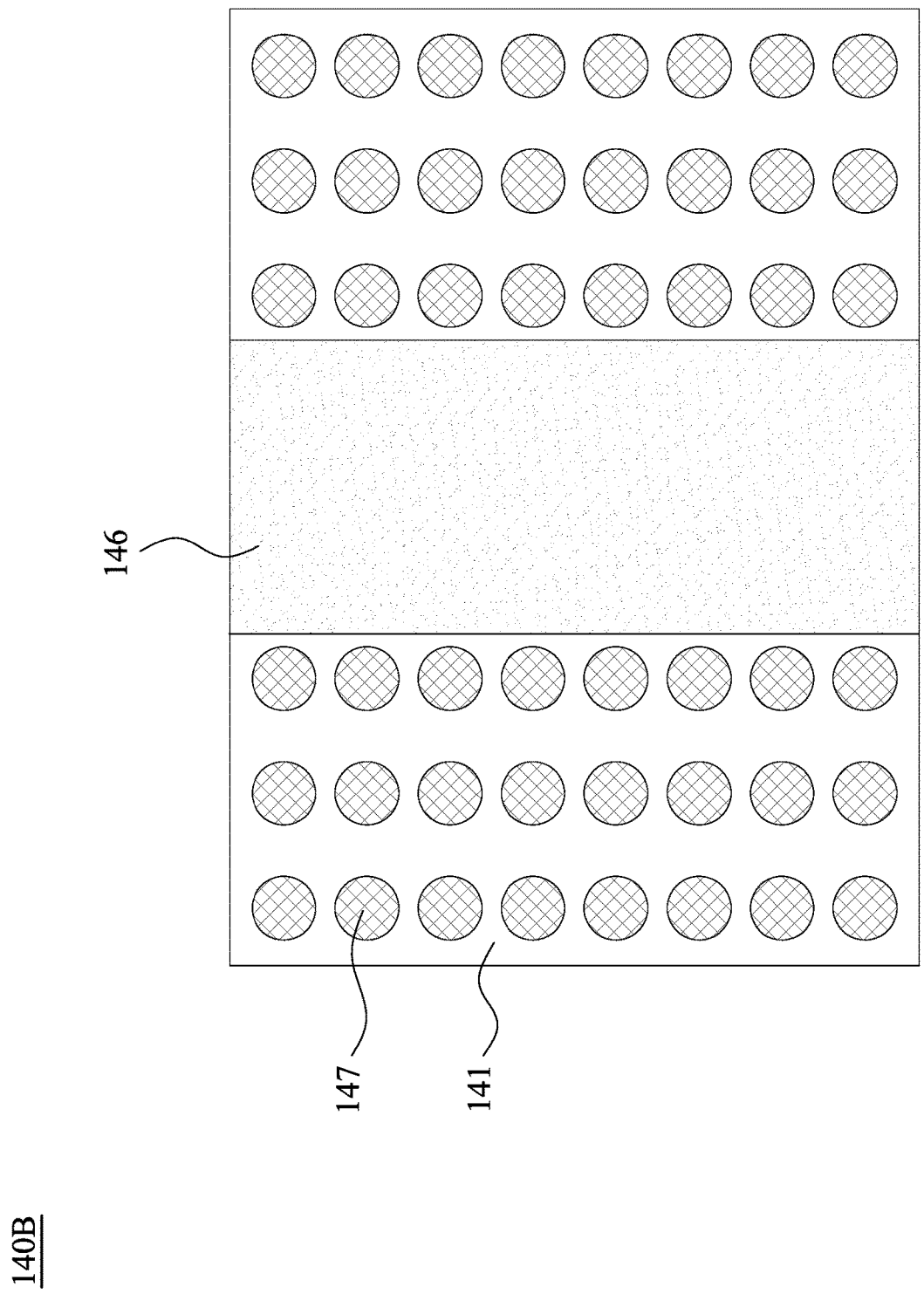
FIG. 4B is an underside view of a semiconductor device, in accordance with some embodiments of the present disclosure.

FIG. 4B is an underside view of a semiconductor device 140B, in accordance with some embodiments of the present disclosure. The semiconductor device 140B is the same as the semiconductor device 140A shown in FIG. 4A. Referring to FIG. 4B, the semiconductor device 140B includes a substrate 141, an underfill 146, and contacts.

The contacts 147 can be arranged in a contact configuration. For example, the contacts 147 can be arranged in an array. The number of the contacts is not limited and can be modified according to design. The semiconductor device 140B can have two portions of contacts 147, separated by the window 144 filled with the underfill 146.

Figure 4C:
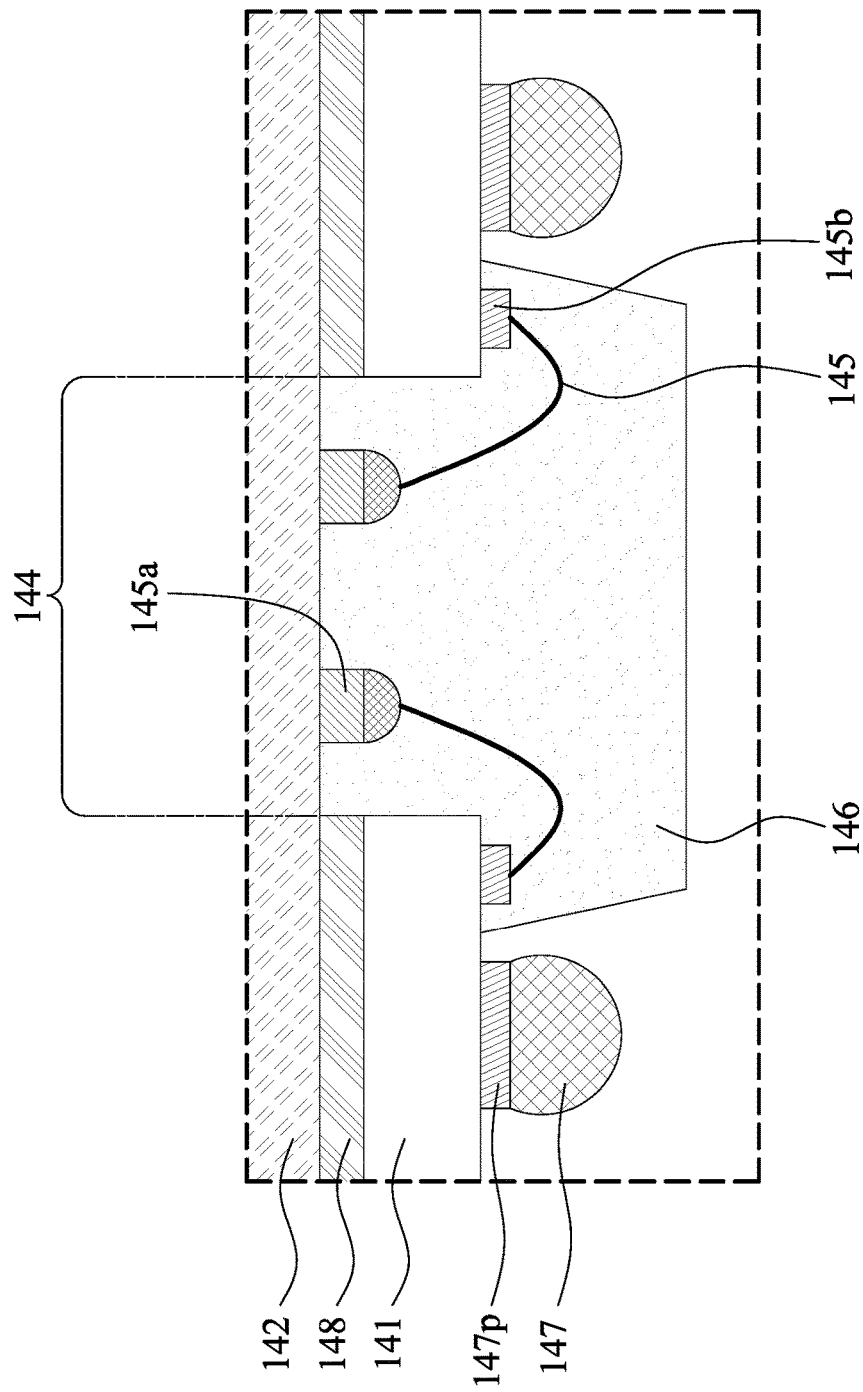
FIG. 4C is a cross-section of a semiconductor device, in accordance with some embodiments of the present disclosure.

FIG. 4C is a cross-section of a semiconductor device 140C, in accordance with some embodiments of the present disclosure. FIG. 4C is an enlarged view of the block 140C in FIG. 4A. The semiconductor device 140C includes a substrate 141, a die 142, a window 144, bonding wires 145, bonding pads 145a, conductive pads 145b, underfill 146, contacts 147, contact pads 147p, and an adhesive 148.

Referring to FIG. 4C, one or more bonding pads 145a can be disposed on the active surface of the die 142. The bonding pads 145a can be located in the window 144. In one embodiment, the bonding pads 145a can protrude from the active surface of the die 142. In some embodiments, the bonding pads 145a can be configured to receive conductive structure, such as bonding wires 145. In some embodiments, the bonding pads 145a includes copper, tungsten, aluminum, palladium or alloys thereof.

One or more conductive pads 145b can be disposed on the substrate 141. In some embodiments, the conductive pads 145b are adjacent to the opening of the substrate 141. In other words, the conductive pads 145b can be located adjacent to the window 144. In one embodiment, the conductive pads 145b can protrude from the substrate 141. In another embodiment, the conductive pads 145b can be embedded in the substrate 141. In some embodiments, the conductive pads 145b can be configured to receive conductive structure, such as bonding wires 145. In some embodiments, the conductive pads 145b can include copper, tungsten, aluminum, palladium or alloys thereof.

In some embodiments, the conductive pads 145b can be similar to the contact pads 147p. In one embodiment, the size of the conductive pads 145b can be different from the contact pads 147p. For example, the conductive pads 145b can be narrower than contact pads 147p. In some embodiments, the conductive pads 145b can have a width substantially identical to that of the contact pads 147p.

In some embodiments, the die 142 can be electrically connected to the substrate 141 by a bonding wire 145. The bonding pad 145a can be electrically connected to the conductive pad 145b by the bonding wire 145, such that the die 142 is electrically communicable with the substrate 141 or an external unit.

In some embodiments, the underfill 146 can be filled in the opening of the substrate 141. The underfill 146 can cover a part of the substrate 141. In some embodiments, the underfill 146 can cover the bonding pads 145a, the bonding wires 145, and the conductive pads 145b.

In some embodiments, the underfill 146 can have an underside surface parallel to the active surface of the die 142. In one embodiment, the underside surface of the underfill 146 can be lower than the contact 147. For example, the contact 147 can be disposed between the substrate 141 and the underside surface of the underfill 146. In another embodiment, the underside surface of the underfill 146 can be level with the contact 147. In some embodiments, the surface of the underfill 146 can be located vertically between the substrate 141 and the contact 147.

Width of underfill 146 can taper from the substrate 141 toward the underside surface of the underfill 146. The underfill 146 can have a lateral surface ending between the contact pad 147p and the conductive pad 145b. In some embodiments, the lateral surface of the underfill 146 can be non-perpendicular to the substrate 141.

Figure 4D:
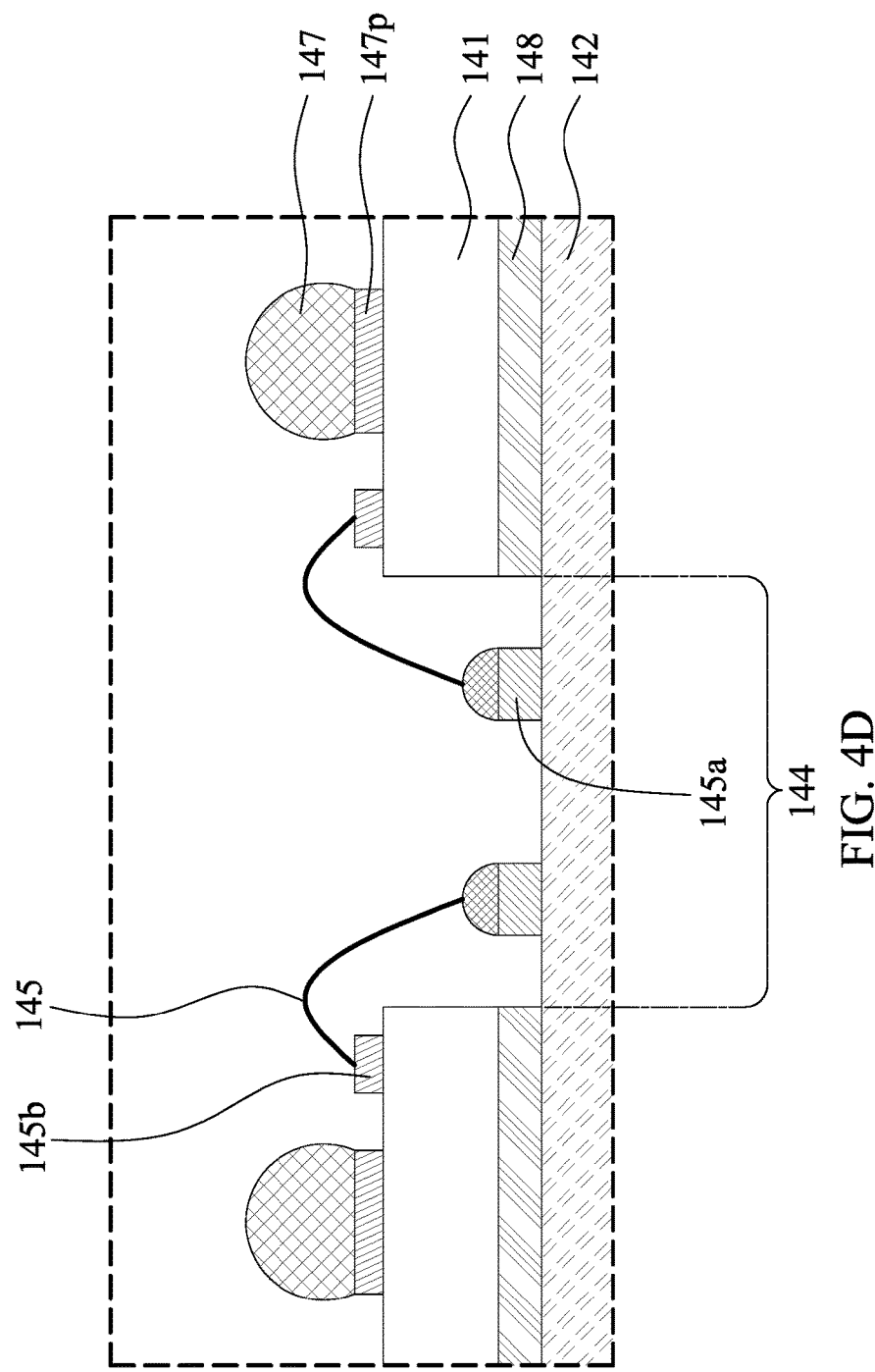
FIG. 4D is a cross-section of a semiconductor device, in accordance with some embodiments of the present disclosure.

FIG. 4D is a cross-section of a semiconductor device 140D, in accordance with some embodiments of the present disclosure. The semiconductor device 140D is similar to the semiconductor device 140C in FIG. 4C, differing therefrom in that in FIG. 4D, the semiconductor device 140D is laterally inverted, and the underfill 146 is removed to expose the window 144.

Referring to FIG. 4D, the underfill 146 is removed to expose the bonding pads 145a, the bonding wires 145, and the conductive pads 145b, and thus facilitate the internal probe test. Once the underfill 146 is removed, the window 144 can be observed by the monitoring unit during the internal probe test, such that the semiconductor device 140D can be properly checked.

Figure 5A:
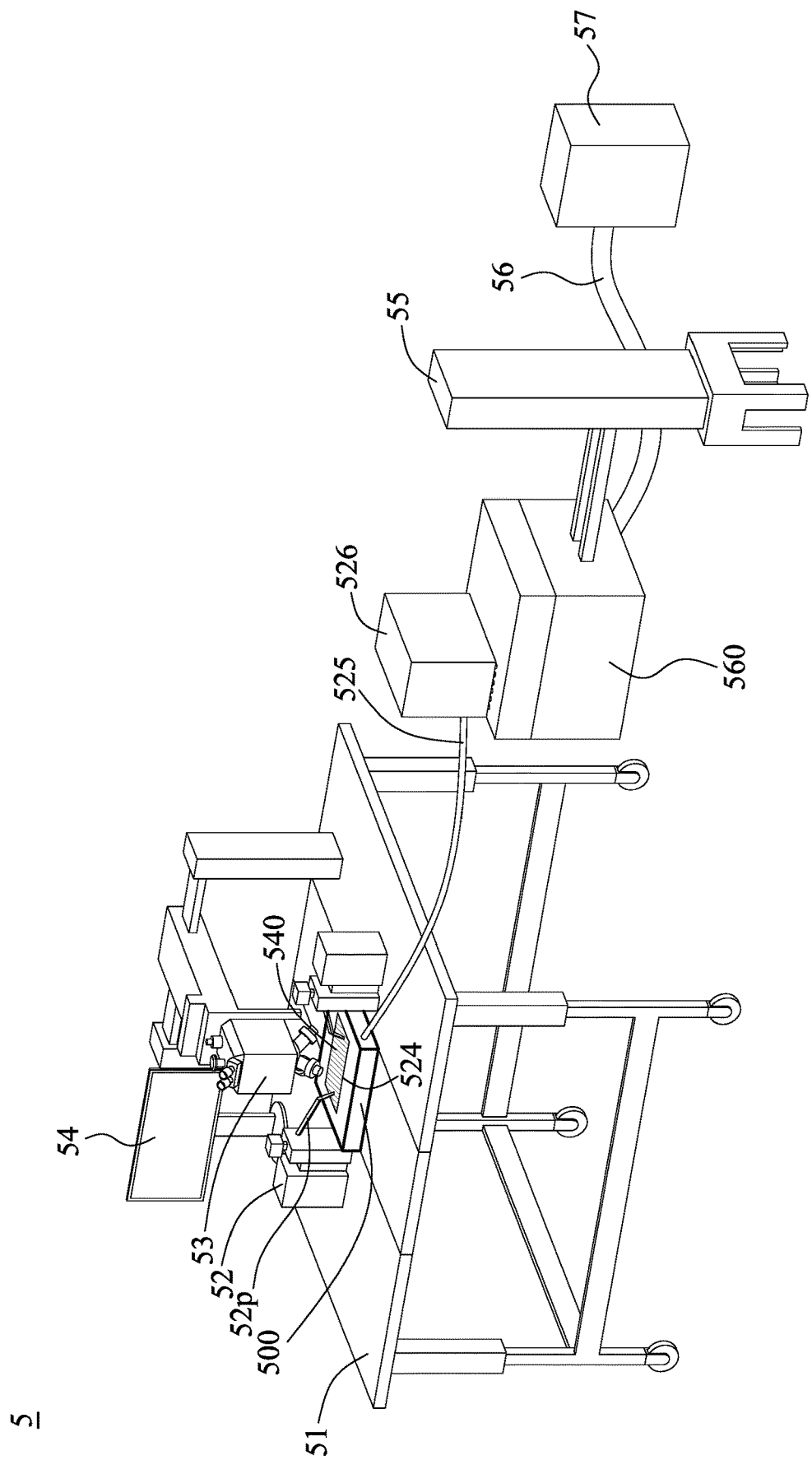
FIG. 5A is a perspective view of a probe apparatus, in accordance with some embodiments of the present disclosure.

FIG. 5A is a perspective view of a probe apparatus 5, in accordance with some embodiments of the present disclosure.

The probe apparatus 5 may be used to test the electrical characteristics of the device under test (DUT) (for example, the DUT 140) to verify compliance with product specifications. The probe apparatus 5 may also be referred to as a piece of probing equipment. In some embodiments, the DUT can be accommodated within a testing device (such as the testing device 100), and such testing device can be placed on the probe apparatus 5 for testing the DUT.

Referring to FIG. 5A, the probe apparatus 5 may include a platform 51, a manipulator 52, a monitoring device 53, a screen 54, a support stand 55, a cable 56, a signal source 57, a testing device 500, and a test head 560. A DUT 540 may be supported, accommodated or received by the testing device 500.

The testing device 500 can be the testing device 100, 200, 300A, or 300B as described. The DUT 540 can be the DUT 140 as described. Descriptions thereof are not repeated for clarity.

In some embodiments, the testing device 500 can be disposed on the platform 51. The testing device 500 can be located adjacent to the manipulators 52. In some embodiments, the testing device 500 can be disposed under the monitoring device 53. The testing device 500 can be mounted to the platform 51 in any manner. In some embodiments, the testing device 500 may be hard mounted (e.g., bolted) to the platform 51. For example, the testing device 500 can be firmly connected to the platform 51.

Although there are several units or components in the probe apparatus 5, the present disclosure is not limited thereto. For example, in some embodiments, there may be any number of units in the probe apparatus 5. For example, in some embodiments, the probe apparatus 5 may also include (or interact with) other hardware and/or utility units not depicted in FIG. 5A, such as a processing unit, a detection unit, a memory unit, a communication unit, etc.

The platform 51 can include a plurality of columnar members supporting the platform 51. The platform 51 may have a consistent or uniform thickness. The platform 51 may be thick enough to provide structural support for the manipulator 52, the monitoring device 53, the screen 54, and the testing device 500.

One or more manipulators 52 may be disposed on the platform 51. The manipulator 52 may be adjacent to the testing device 500. Each of the manipulators 52 may have a probe 52p or a conductive portion in the form of probe. The testing device 500 can have an opening 524 (such as the opening 124 shown in FIG. 3A) exposing the DUT 540, such that the probe 52p can access the DUT 540. For example, the probe 52p of the manipulator 52 may extend into the opening 524 to contact the DUT 540.

The manipulator 52 may have or utilize a magnetic mounting base or a vacuum/suction mounting base to attach to the platform 51. For example, the manipulator 52 may have a mounting base of magnetic material capable of securing the manipulator 52 to the platform 51 of magnetically attractive material, such as metal. However, in some other embodiments, the manipulator 52 may be hard mounted (e.g., bolted) to the platform 51 to provide structural stability for precision probing.

The manipulator 52 may be configured to position the probe 52p. For example, the manipulator 52 may be configured to move the probe 52p along x, y and z orientations (or x-, y-, and z-axes). In some embodiments, the manipulator 52 may also be configured to adjust the angle (such as the attack angle) between the probe 52p and the DUT 540.

In some embodiments, the manipulator 52 may be connected to, and driven by, a motor or a drive mechanism. In some embodiments, the motor or drive mechanism of the manipulator 52 may be controlled by the processing unit of the probe apparatus 5 or a processing unit interacting with the probe apparatus 5.

The detection unit of the probe apparatus 5 or a processing unit interacting with the probe apparatus 5 may be in communication with the processing unit. In some embodiments, the detection unit may also be in communication with the manipulator 52.

In some embodiments, the testing device 500 can be positioned on the platform 51, and the desired portion of the DUT 540 can be positioned under the monitoring device 53. In addition, the manipulator 52 may be configured to actually position the probe 52p on the desired location or test site (e.g., the desired conductive path indicia) of the DUT 540.

Although two manipulators are shown, the probe apparatus 5 can utilize additional manipulators. For example the probing device may be configured to run six or more manipulators.

The monitoring device 53 may be disposed on the platform 51 and allow an operator of probe apparatus 5 to monitor the condition of the DUT 540 and ensure probe contact therewith.

In some embodiments, the monitoring device 53 may include an optical microscope. In some embodiments, the monitoring device 53 can include a high resolution microscope, such as a scanning electron microscope (SEM), a focused ion beam (FIB) system, or the like. In some embodiments, using SEM and/or FIB, the probe apparatus 5 may conduct the inspection method via a non-contact probing process. For example, current path tracing tests, via electron-beam-induced current (EBIC) analysis and optical-beam-induced current (OBIC) analysis, may be conducted.

In some embodiments, the monitoring device 53 may include a camera configured to capture an image of the DUT 540. In some embodiments, the camera may be configured to capture an image of the DUT 540 during the inspection method of the present disclosure. In some embodiments, the camera may be configured to capture an image of the DUT 540 in situ. In some embodiments, the camera can be configured to capture an image of the window (such as the window 144) of the DUT 540.

In some embodiments, the camera may include one or more lenses (such as objective lens, zoom lens, relay lens, imaging lens, condensing lens, etc.), one or more light sources (such as a low-power light source, an external light source, a near-infrared light source, etc.), a charge-coupled device (CCD), a complementary metal-oxide semiconductor (CMOS) imaging sensor, or one or more signal converters (such as an analog-to-digital (A/D) converter). In some embodiments, the camera may be omitted.

In some embodiments, the images may be transmitted or updated to a memory unit of the probe apparatus 5 or a memory unit interacting with the probe apparatus 5. In some embodiments, the images may be transmitted or updated to the screen 54.

The screen 54 may be disposed on the platform 51. The screen 54 may include a display, a panel or a monitor. The screen 54 may be configured to show the images from the monitoring device 53.

In some embodiments, the probe apparatus 5 may incorporate a programmed utility to control the probe 52$p$. The interface of the utility can be made available via the screen 54, allowing manipulation of the probe 52$p$, to a desired location or test site on the DUT 540, via, for example, on screen manipulation of a cursor.

In some embodiments, computer interface controls or input devices associated with the screen 54 may include, e.g., a keyboard, mouse, joystick, touch sensitive screen, switches or the like.

In some embodiments, moving the cursor may cause a relative position or a relative movement between the probe 52$p$ and the DUT 540. In some embodiments, the utility may be programmed to operate the manipulator 52 to move the probe 52$p$ along x, y and z directions.

The test head 560 may be supported by the support stand 55. The test head 560 may provide an electrical path between the signal source 57 and the DUT 540. For example, the test head 560 may have a connector (not illustrated in the figures) connected with the cable 56 and another connector (not illustrated in the figures) connected with the terminal 526 (such as the terminal 126 in FIG. 1) of the testing device 500.

In some embodiments, the testing device 500 can include a cable 525 and a terminal 526. The terminal 526 can electrically connect the DUT 540 to external units through the cable 525. For example, the terminal 526 can connects to the test head 560 through the cable 525.

In some embodiments, the DUT 540 can electrically connected to the test head 560. In some embodiments, the DUT 540 can electrically connect to the signal source 57 through the test head 560.

The support stand 55 may support the test head 560 and keep the test head 560 away from the ground. Therefore, in some embodiments, the connector of test head 560 for connecting the cables 56 may be located on the underside surface of the test head 560 facing the ground.

The signal source 57 may be electrically coupled to the test head 560 through, for example, the cable 56. Examples of the cable 56 may include a BNC/coaxial cable, a triaxial cable, a conduit cable, a piping connector, etc. In some embodiments, the cable 525 can be similar to the cable 56.

The signal source 57 may be configured to provide a signal (such as an electrical signal) to test the DUT 540. During the inspection method of the present disclosure, a plurality of electrical signals may be generated by the signal source 57 and transmitted to the DUT 540 through the cable 56, the test head 560, the terminal 526, the cable 525, and a circuit board (such as circuit board 122 in FIG. 1) of the testing device 500.

In some embodiments, the processing unit may be configured to conduct an inspection method or inspection process of the present disclosure. The processing unit may be configured to execute algorithms or computer-executable instructions stored in a memory such as the memory unit of the probe apparatus 5 or another medium.

In some embodiments, the processing unit may include (or may be) a processor (e.g., a central processing unit (CPU), a graphic processing unit (GPU), a micro processing unit (MCU), an application specific integrated circuit (ASIC) or the like) or a controller.

In some embodiments, the detection unit may be configured to detect shift, tilt, rotation, or other movement of each of the manipulators 52. For example, the detection unit may be configured to detect the movement of the manipulator 52 with respect to the DUT 540.

In some embodiments, the detection unit may be configured to transmit the detection results to the processing unit through the communication unit. In some embodiments, the processing unit may be configured to receive the detection result and then adjust the movement of the movement of the manipulator 52 based on the detection result. For example, the processing unit may be configured to adjust the moving direction, angle, and distance of each of the manipulators 52.

In some embodiments, the detection unit may include a rangefinder, a LiDAR, or another motion control mechanism or a feedback mechanism configured to detect information about an environment of the DUT 540 and output the information.

The memory unit of the probe apparatus 5 or a processing unit interacting with the probe apparatus 5 may be configured to store algorithms or computer-executable instructions of the processing unit. The memory unit may also be configured to store data, such as the trajectory of the movement of the movement of manipulator 52. The memory unit may also be configured to store the detection result of the detection unit.

In some embodiments, the memory unit may include random access memory (RAM), read only memory (ROM), hard drives, as well as removable memory devices, which can include memory sticks, memory cards, flash drives, external hard drives, and so on.

The communication unit of the probe apparatus 5 or a processing unit interacting with the probe apparatus 5 may be configured to send/receive data to/from the probe apparatus 5 via wired or wireless techniques (e.g., Wi-Fi, cellular networks, Bluetooth, or the like). In some embodiments, the communication unit may include a wireless communication transceiver. For example, the communication unit may include a transmitter, a receiver, an antenna, and so on.

The present disclosure may be embodied as a system, method, computer program or any combination thereof. Accordingly, embodiments of the present disclosure may comprise exclusively hardware or exclusively a programmed utility (including firmware, resident utility, microcode, etc.) or a combination thereof that may all generally be referred to herein as a "unit," "module" or "system." Furthermore, the present disclosure may take the form of a computer program embodied in any tangible medium of expression having computer usable program code embodied in the medium.

The present disclosure may be described in the general context of algorithms or computer-executable instructions, such as programs, being executed by a computer. Generally, programs include routines, programs, objects, components, data structures, etc., that perform particular tasks or implement particular abstract data types. The present disclosure may also be practiced in distributed computing environments where tasks are performed by remote processing devices that are linked through a communications network. In a distributed computing environment, programs may be located in both local and remote computer storage media including memory storage devices.

Figure 5B:
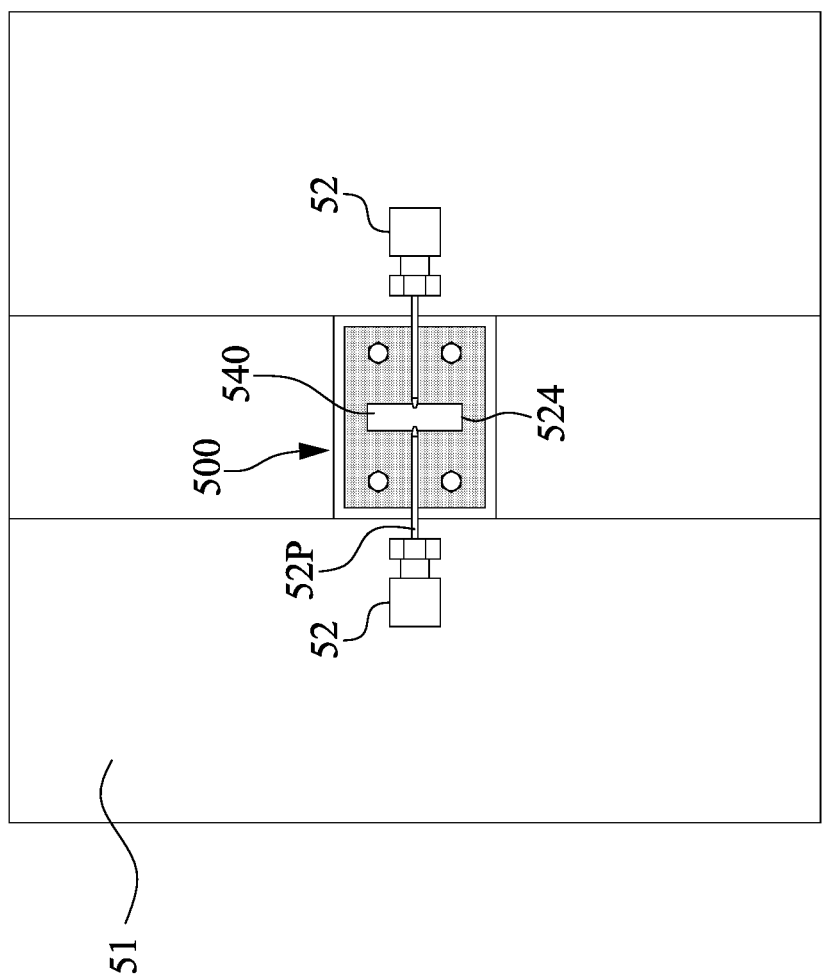
FIG. 5B is a top view of a part of the probe apparatus, in accordance with some embodiments of the present disclosure.

FIG. 5B is a top view of a part of the probe apparatus 5, in accordance with some embodiments of the present disclosure.

As shown, when the testing device 500 and the DUT 540 are disposed below the monitoring device 53, the DUT 540 can be exposed by the opening 524 of the testing device 500. For example, at least the window (for example, the window 144) of the DUT 540 can be exposed by the opening 524 of the testing device 500. The opening 524 may provide access for the probe 52p to the DUT 540. For example, the probe 52p of the manipulator 52 may extend into the opening 524 to contact the DUT 540.

Figure 6:
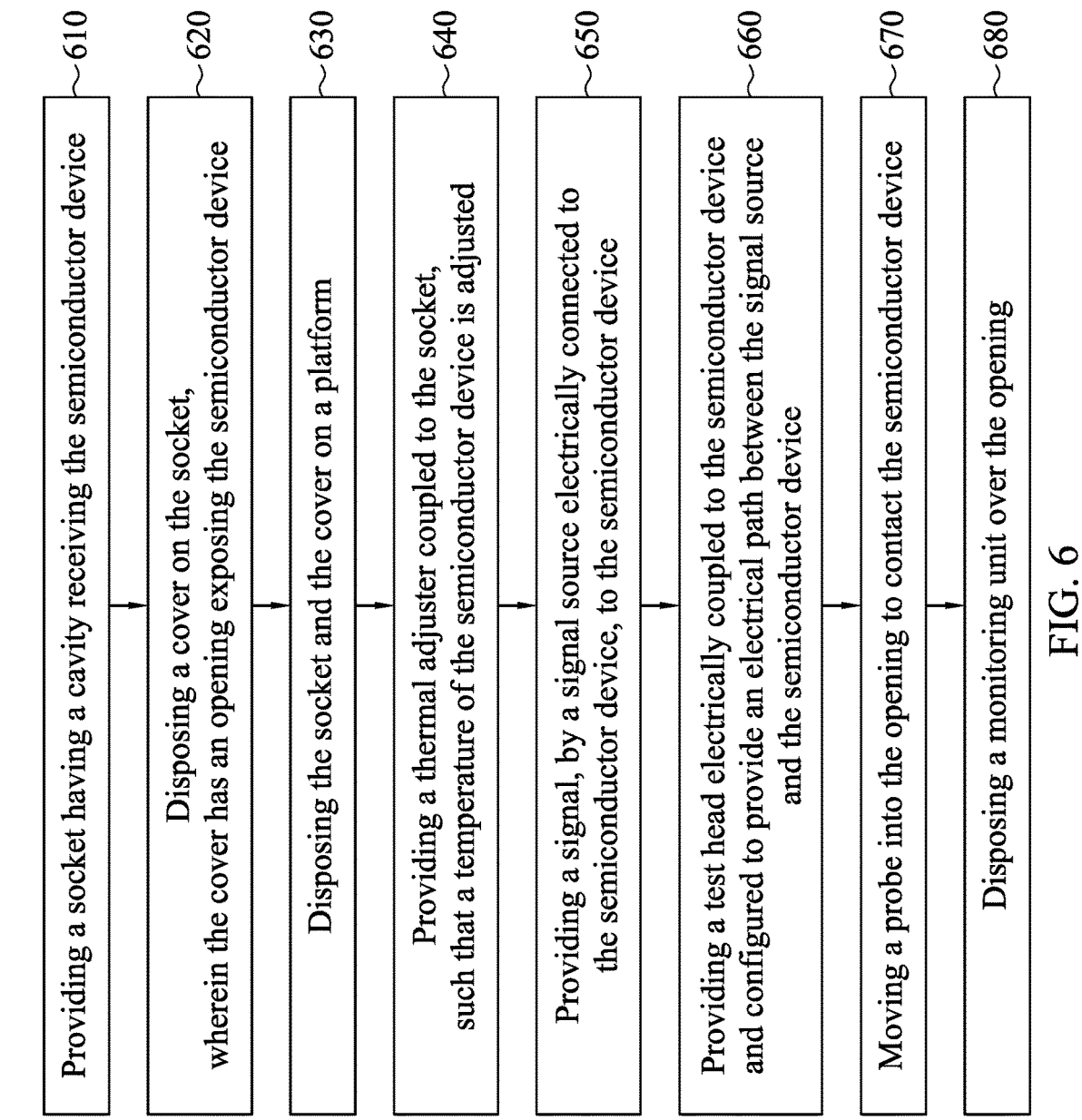
FIG. 6 is a flowchart of a method for testing a semiconductor device, in accordance with some embodiments of the present disclosure.

FIG. 6 is a flowchart of a method 600 for testing a semiconductor device, in accordance with some embodiments of the present disclosure. In some embodiments, the method 600 can be conducted for operating the test performed on the DUT 540 as described in FIGS. 5A and 5B. The method 600 can include operations 610, 620, 630, 640, 650, 660, 670, and 680.

For better understanding, the method 600 may be described with reference to the probe apparatus 5 shown in FIGS. 5A and 5B.

In operation 610, a socket with a cavity can be provided. The cavity of the socket can receive a semiconductor device. For example, the socket 110 can have a cavity 114 for accommodate the DUT 140 as shown in FIGS. 2 and 3A-3B. In some embodiments, the socket can include a thermal conductive material.

In operation 620, a cover can be disposed on the socket. For example, the cover 120 can be disposed on the socket 110 as shown in FIGS. 3A and 3B. In some embodiments, the cover 120 has an opening 124 exposing the DUT 140. In one embodiment, the DUT 140 can be is a WBGA package device. When the DUT 140 is a WBGA package device, the underfill 146 in the window 144 of the DUT 140 can be removed during the probe test (as shown in FIG. 4D).

In operation 630, the socket and the cover can be disposed on a platform. For example, the socket 110 and the cover 120 can be combined and disposed on the platform 51. The socket 110 and the cover 120 can be connected to be a testing device 500, and then placed on the platform 51.

In operation 640, a thermal adjuster can be coupled to the socket so that a temperature of the semiconductor device received in the socket can be adjusted. For example, the thermal adjuster 150 can be disposed under and thermally coupled to the socket 110 as shown in FIGS. 3A and 3B. A temperature of the socket 110 can be adjusted (heated or cooled) by the thermal adjuster 150, such that the temperature of the DUT 140 can be adjusted. The temperature of the DUT 140 can be adjusted for different test requirements.

In operation 650, a signal source, electrically connected to the semiconductor device, can provide a signal to the semiconductor device. For example, the signal source 57 can electrically connected to the DUT 540, such that the signal generated by the signal source 57 can be provided to the DUT 540 as shown in FIG. 5A.

In operation 660, a test head can be provided, wherein the test head can be electrically coupled to the semiconductor device and configured to provide an electrical path between the signal source and the semiconductor device. For example, the test head 560 can electrically couple to the DUT 540 as shown in FIG. 5A. The test head 560 can be configured to provide the electrical path (for example, through the cables 525 and 56) between the signal source 57 and the DUT 540. In some embodiments, the signal generated by the signal source 57 can be transmitted to the DUT 540 through the cable 56, the test head 560, the terminal 526, and the cable 525.

In operation 670, a probe can move into the opening to contact the semiconductor device. For example, the probe 52p can move into the opening 524 to contact the DUT 520 as shown in FIGS. 5A and 5B. In some embodiments, the probe 52p can be positioned by the manipulator 52.

In operation 680, a monitoring unit can be disposed over the opening of the cover. For example, the monitoring device 53 can be disposed on the opening 524 as shown in FIG. 5A. In some embodiments, the monitoring device 53 can be aligned with the opening 524 exposing the DUT 540, such that a user of the probe apparatus 5 can monitor the condition of the DUT 540 and ensure probe contact therewith.

One aspect of the present disclosure provides a testing device. The testing device includes a socket having a cavity for accommodating a device under test (DUT), and a cover disposed on the socket. The socket includes a thermal conductive material. The cover includes a plate, a circuit board attached to the plate, and an opening penetrating the plate and the circuit board to expose the cavity of the socket.

Another aspect of the present disclosure provides a probe apparatus. The probe apparatus includes a platform, a manipulator on the platform having a probe, and a testing device on the platform. The testing device includes a socket having a cavity for accommodating a device under test (DUT), and a cover disposed on the socket. The socket includes a thermal conductive material. The cover include a plate, a circuit board attached to the plate, and an opening penetrating the plate and the circuit board, exposing the DUT in the cavity of the socket.

Another aspect of the present disclosure provides a method for testing a semiconductor device. The method includes providing a socket having a cavity receiving the semiconductor device, wherein the socket includes a thermal conductive material; disposing a cover on the socket, wherein the cover has an opening exposing the semiconductor device; disposing the socket and the cover on a platform; and moving a probe into the first opening to contact the semiconductor device.

The subject disclosure provides a testing device receiving a DUT therein. The active surface of the DUT can face the opening of the testing device so that a user of the probe apparatus can monitor the condition of the DUT 540 and ensure probe contact therewith through the opening during the probe test. Furthermore, the testing device can include a thermal adjuster to adjust the temperature of the DUT. For this purpose, the socket of the testing device can include a thermal conductive material, such as copper. Accordingly, the DUT can be adjusted to a desired environment for testing.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A probe apparatus, comprising:
    a platform;
    a manipulator on the platform and having a probe; and
    a testing device on the platform, the testing device including:
        a socket having a cavity for accommodating a device under test (DUT), wherein the socket includes a thermal conductive material;
        a cover disposed on the socket, the cover including:
            a plate;
            a circuit board attached to the plate; and
            an opening penetrating the plate and the circuit board for exposing the cavity of the socket.

2. The probe apparatus of claim 1, further comprising a thermal adjuster coupled to the socket, such that a temperature of the socket is adjusted.

3. The probe apparatus of claim 1, further comprising an adhesive disposed between the circuit board and the socket.

4. The probe apparatus of claim 3, wherein the adhesive is conductive, such that the circuit board electrically connects to the DUT accommodated in the socket.

5. The probe apparatus of claim 1, further comprising a monitoring unit disposed on the platform and aligned with the DUT.

6. The probe apparatus of claim 1, further comprising a signal source electrically connected to the testing device, wherein the signal source is configured to provide a signal.

7. The probe apparatus of claim 6, further comprising:
    a test head electrically coupled to the testing device and configured to provide an electrical path between the signal source and the testing device.

8. The probe apparatus of claim 1, wherein the DUT comprises a DRAM device.

9. The probe apparatus of claim 1, wherein the DUT is a window ball grid array (WBGA) package device.

10. The probe apparatus of claim 1, wherein the socket includes copper.

11. The probe apparatus of claim 1, wherein the manipulator is configured to move the probe into the opening of the cover and contact the DUT.

\* \* \* \* \*